(12) United States Patent
Chaudhary et al.

(10) Patent No.: US 8,085,518 B2
(45) Date of Patent: Dec. 27, 2011

(54) ELECTRONIC CIRCUIT, ELECTRONIC CIRCUIT ARRANGEMENT AND METHOD FOR PRODUCING AN ELECTRONIC CIRCUIT

(75) Inventors: Nirmal Chaudhary, Boise, ID (US); Christian Russ, Diedorf (DE); Thomas Schulz, Heverlee (BE)

(73) Assignee: Infineon Technologies AG, Neubiberg (DE)

( * ) Notice: Subject to any disclaimer, the term of this patent is extended or adjusted under 35 U.S.C. 154(b) by 1036 days.

(21) Appl. No.: 11/436,235

(22) Filed: May 18, 2006

(65) Prior Publication Data

US 2007/0025034 A1 Feb. 1, 2007

(30) Foreign Application Priority Data

May 18, 2005 (DE) .................. 10 2005 022 763

(51) Int. Cl.
*H02H 9/00* (2006.01)
(52) U.S. Cl. ........................................... 361/56
(58) Field of Classification Search ............ 361/56
See application file for complete search history.

(56) References Cited

U.S. PATENT DOCUMENTS

| 5,274,262 | A | * | 12/1993 | Avery ........................ 257/362 |
| 5,465,189 | A | | 11/1995 | Polgreen et al. |
| 5,773,864 | A | | 6/1998 | Merrill |
| 6,021,071 | A | * | 2/2000 | Otsuka ..................... 365/189.05 |
| 6,034,552 | A | * | 3/2000 | Chang et al. ................. 326/83 |
| 6,100,565 | A | * | 8/2000 | Ueda ........................... 257/348 |
| 6,242,763 | B1 | * | 6/2001 | Chen et al. .................... 257/107 |
| 6,433,609 | B1 | | 8/2002 | Voldman |
| 6,587,320 | B1 | | 7/2003 | Russ et al. |
| 6,642,088 | B1 | | 11/2003 | Yu |
| 6,720,619 | B1 | | 4/2004 | Chen et al. |
| 6,750,515 | B2 | | 6/2004 | Ker et al. |
| 7,224,560 | B2 | * | 5/2007 | May et al. ..................... 361/56 |
| 7,268,398 | B1 | * | 9/2007 | Vashchenko et al. ......... 257/355 |
| 2003/0184933 | A1 | * | 10/2003 | Lin et al. ...................... 361/56 |
| 2004/0041215 | A1 | * | 3/2004 | Chaine et al. ................ 257/401 |
| 2004/0090806 | A1 | * | 5/2004 | Yoshida et al. ............... 363/60 |
| 2004/0188705 | A1 | | 9/2004 | Yeo et al. |
| 2006/0114629 | A1 | * | 6/2006 | Wu et al. ...................... 361/56 |
| 2006/0214226 | A1 | * | 9/2006 | Chen et al. ................... 257/347 |

FOREIGN PATENT DOCUMENTS

EP 0 939 439 A1 9/1999
WO WO 2004/051749 6/2004

OTHER PUBLICATIONS

M.G. Khazhinsky et al., "Engineering Single NMOS and PMOS Output Buffers for Maximum Failure Voltage in Advanced CMOS Technologies", 2004 EOS/ESD Symposium.
P. Raha et al., "Reliability of Partially Depleted SOI Technology", In: IEEE Transactions on Electron Devices, vol. 46, No. 2, Feb. 1999, Seiten 429 bis 431.

(Continued)

*Primary Examiner* — Rexford Barnie
*Assistant Examiner* — Ann Hoang

(57) ABSTRACT

An electronic circuit and method for producing the electronic circuit, where the electronic circuit includes a functional circuit including at least one multigate functional field effect transistor and an ESD protection circuit including at least one multigate ESD protection field effect transistor. The multigate protection field effect transistor is a transistor that is partially depleted of electrical charge carriers, and the trigger voltage of the multigate protection field effect transistor is less than the trigger voltage of the multigate functional field effect transistor.

46 Claims, 7 Drawing Sheets

OTHER PUBLICATIONS

Hari Anathan, "FinFET—Current Research Issues", School of Electrical and Computer Engineering, Purdue University, West Lafayette, Indiana 47907.

Xuejue Huang et al., "Sub-50 nm P-Channel FinFET", IEEE Transactions on Elctron Devices, vol. 48, No. 5, May 2001.

W. Xiong et al., "Full/partial depletion effects in FinFETs", Electronics Letters, Apr. 14, 2005, vol. 41, No. 8.

S. Okhonin et al., "FinFET based Zero-capacitor DRAM (Z-RAM) Cell for sub 45 nm Memory Generations", ICMTD-2005.

Office Communication from Search Report from German Patent and Trademark Office, Dated Dec. 13, 2006, pp. 1-5.

Ming-Dou Ker et al., Investigation on ESD Robustness of CMOS Devices in a 1.8-V 0.15-μm Partially-Depleted SOI Salicide CMOS Technology, Integrated Circuits & Systems Laboratory, Institute of Electronics, National Chiao-Tung Universtiy, Hsinchu, Taiwan, pp. 41 & 43 (With respect to Non-Patent Literature Document B2, we are submitting pp. 41 & 43, additional pages will be supplied as soon as they are received.).

Ming-Dou Ker et al., Investigation on ESD Robustness of CMOS Devices in a 1.8-V 0.15μm Partially-Depleted SOI Salicide CMOS Technology, Integrated Circuits & Systems Laboratory, Institute of Electronics, National Chiao-Tung University, Hsinchu, Taiwan, pp. 41-44.

\* cited by examiner

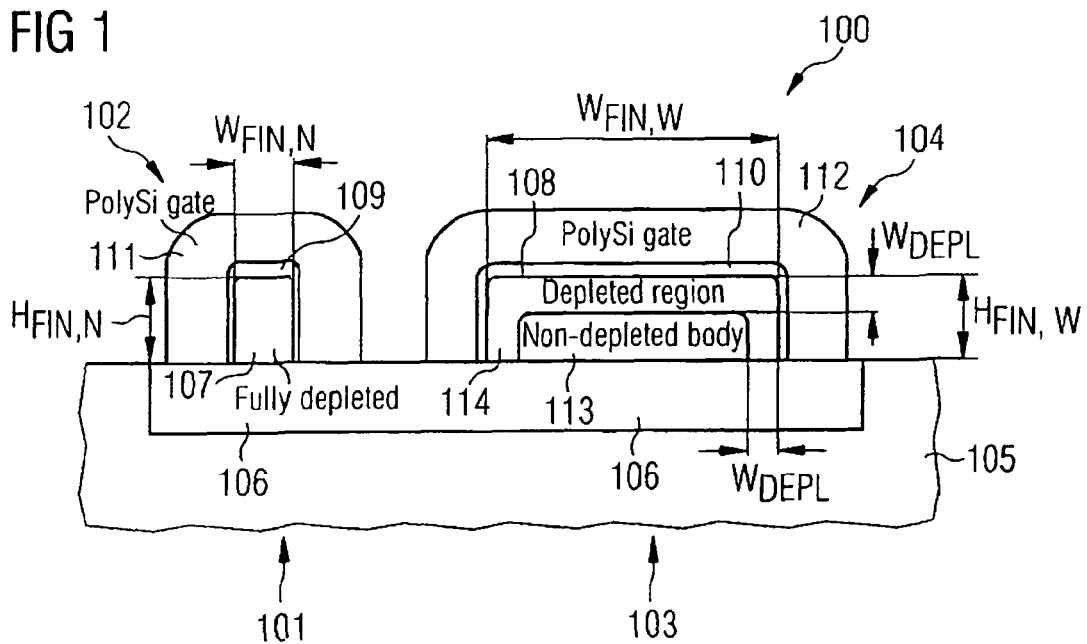
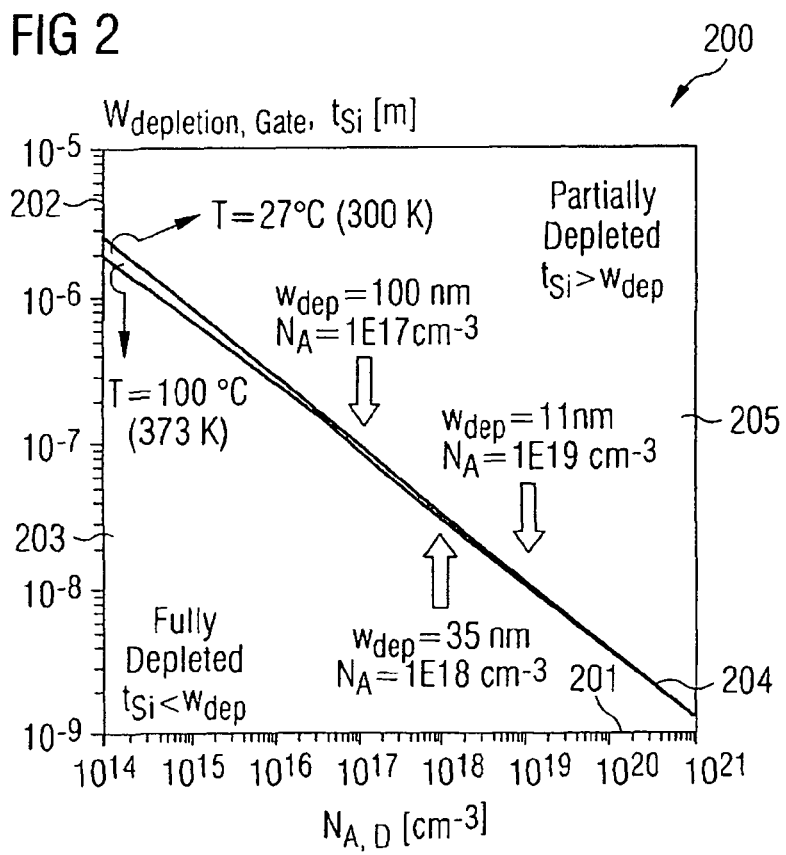

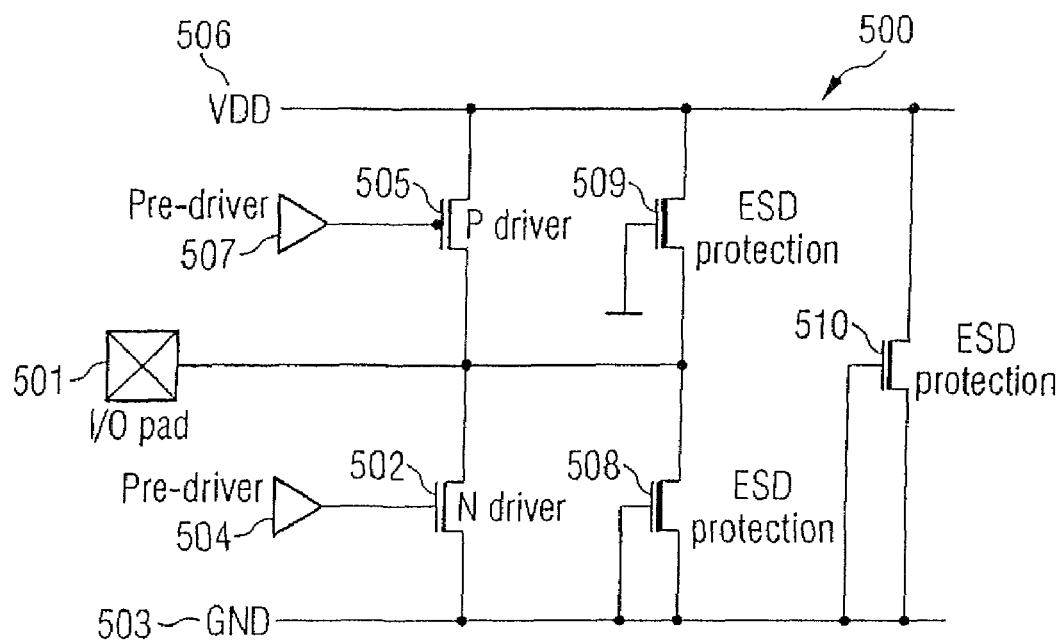

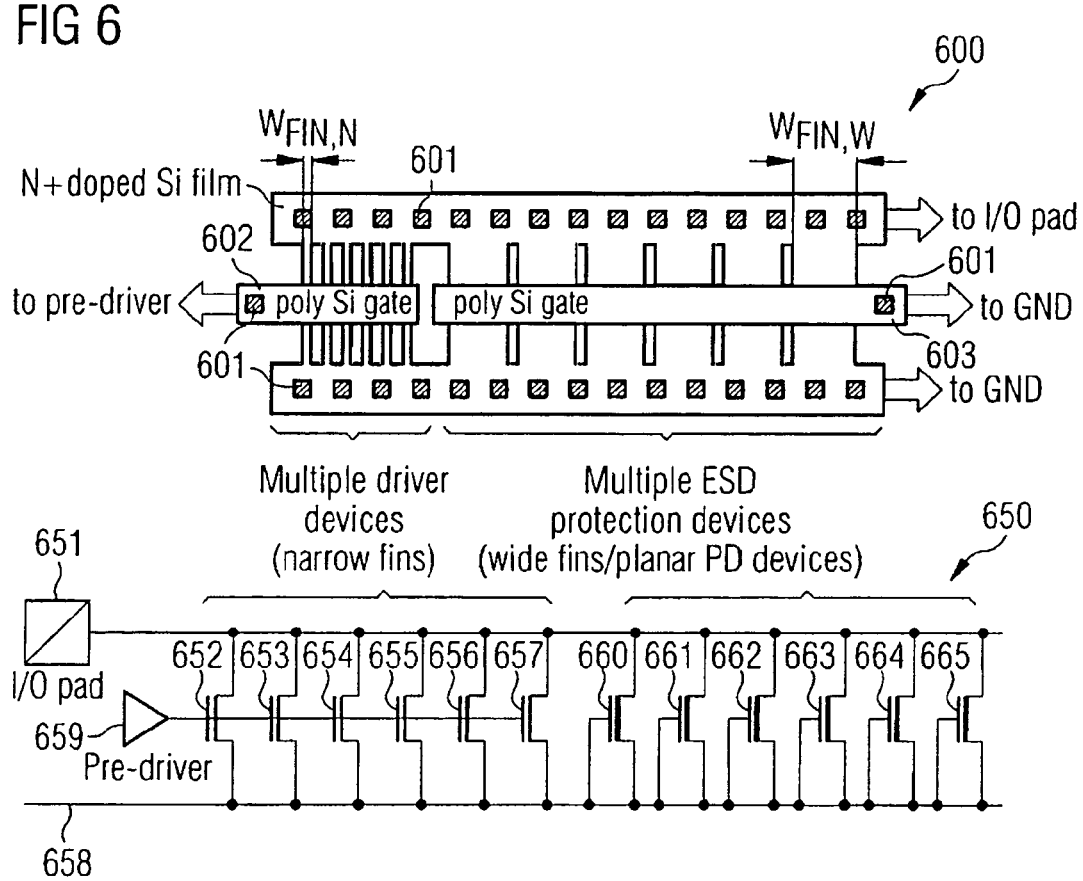

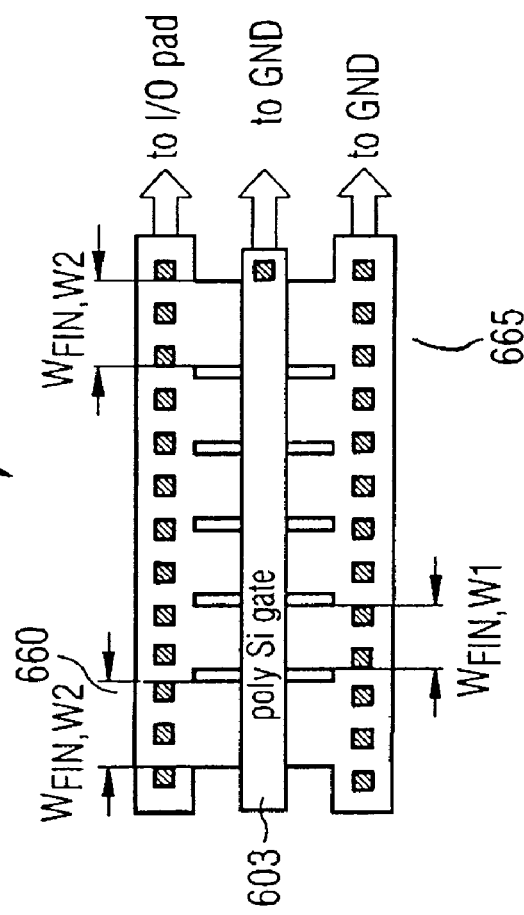
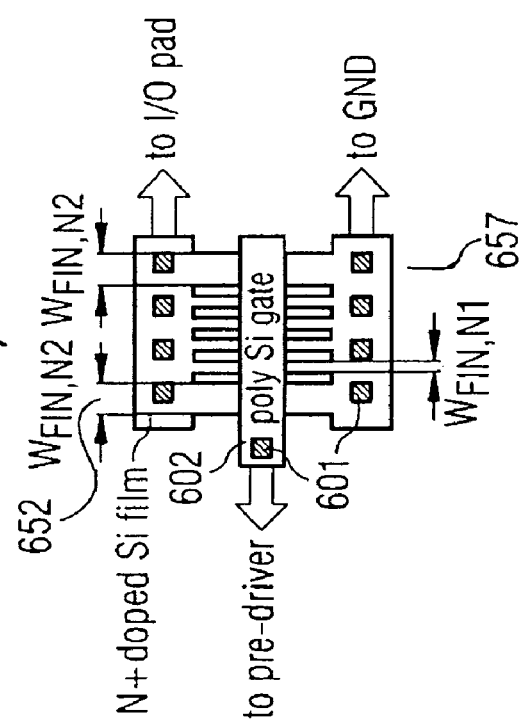

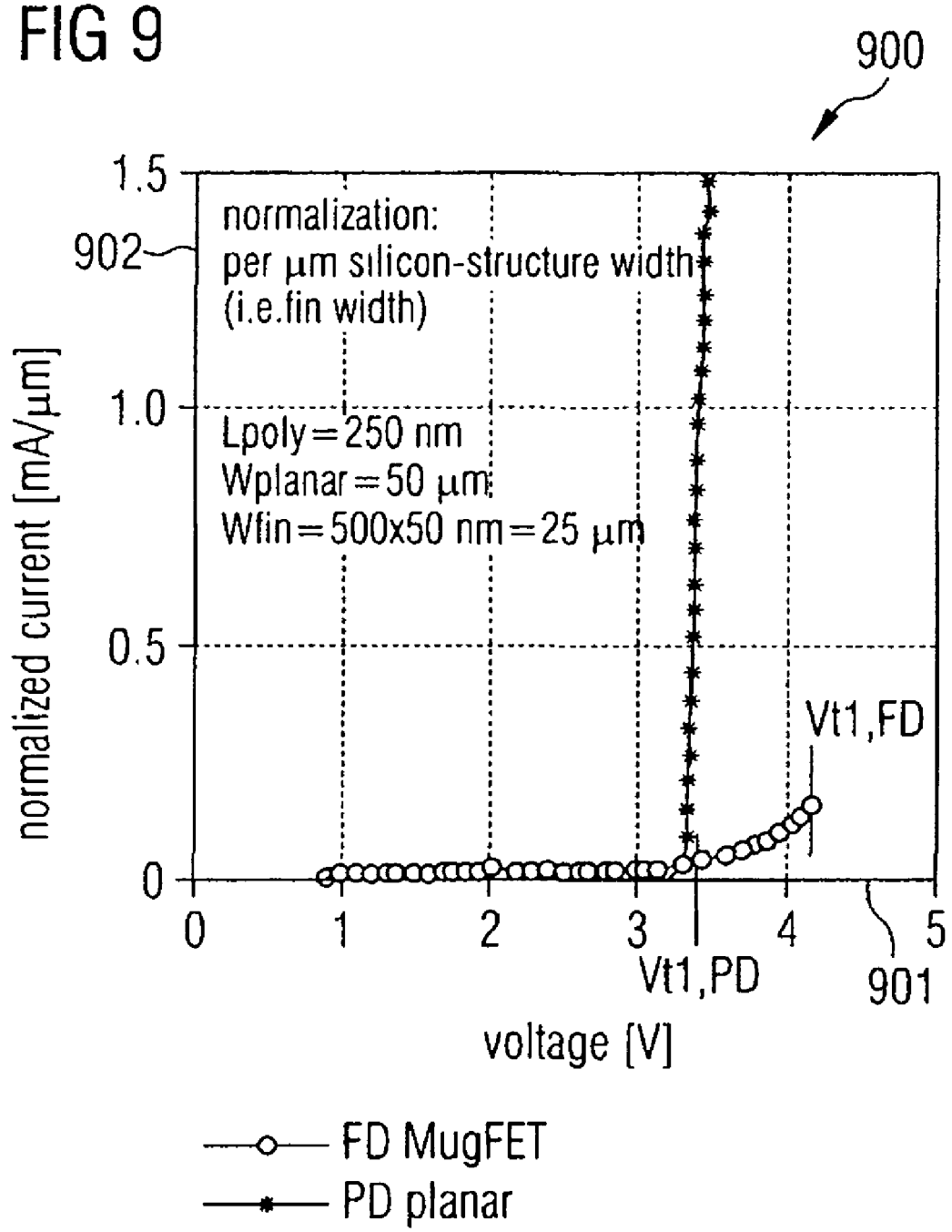

US 8,085,518 B2

ELECTRONIC CIRCUIT, ELECTRONIC CIRCUIT ARRANGEMENT AND METHOD FOR PRODUCING AN ELECTRONIC CIRCUIT

PRIORITY CLAIM

This application claims priority under 35 U.S.C. 119 to German patent application No. 102005022763.5-33, filed May 18, 2005.

TECHNICAL FIELD

The invention relates to an electronic circuit, an electronic circuit arrangement and a method for producing an electronic circuit.

BACKGROUND

Multigate field effect transistor circuits such as fin field effect transistor circuits, for example, as are expected to be used in the future are highly susceptible in particular to damage caused by so-called electrostatic discharge (ESD) on account of their poor thermal properties that are known per se. The main reasons for the poor thermal properties can be seen firstly in the very small geometrical structures and secondly in the thermal insulation that results as a disadvantageous side effect of the electrical insulation of the transistor structures, which are often formed by a thin and electrically conductive silicon film and which are usually applied on a nonconductive buried oxide layer.

In future high technologies, by way of example, output driver circuits (even) for low driver strengths should be reliably protected against electrostatic discharges in such a way that the electrostatic discharge current (ESD current) is short-circuited in parallel with the respective driver circuit and an ESD current that damages the driver circuit and could flow through the highly sensitive driver circuits is consequently prevented. Furthermore, it is desirable, even though the ESD protection circuit is intended to dissipate (is intended to short-circuit) the energy of the ESD current pulse safely and reliably in the direction of the ground potential, to ensure that the ESD protection circuit itself is not damaged when dissipating the ESD current pulse.

For the reasons mentioned above, a low ESD trigger voltage, also referred to as hereinafter as ESD breakdown voltage, of the ESD protection circuit is desirable, in the case of which voltage the driver circuit or generally any circuit to be protected by means of the ESD protection circuit is not yet permitted to trigger. This mechanism, which is also referred to as "trigger competition", requires particular importance in particular in the case of a multigate structure.

SUMMARY

An electronic circuit is provided which includes at least one functional circuit which includes at least one multigate functional field effect transistor including at least two gates. Furthermore, the electronic circuit includes at least one ESD protection circuit which includes at least one multigate protection field effect transistor including at least two gates. The multigate protection field effect transistor is a transistor that is partially depleted of electrical charge carriers, and the trigger voltage of the multigate protection field effect transistor is less than the trigger voltage of the multigate functional field effect transistor.

Furthermore, an electronic circuit arrangement is provided which includes a pad terminal, and an electronic circuit being electrically coupled to the pad terminal. The electronic circuit includes at least one functional circuit which includes at least one multigate functional field effect transistor including at least two gates. Furthermore, the electronic circuit includes at least one ESD protection circuit which includes at least one multigate protection field effect transistor includes at least two gates. The multigate protection field effect transistor is a transistor that is partially depleted of electrical charge carriers, and the trigger voltage of the multigate protection field effect transistor is less than the trigger voltage of the multigate functional field effect transistor.

In a method for producing an electronic circuit, at least one functional circuit is formed which includes at least one multigate functional field effect transistor including at least two gates. Furthermore, at least one ESD protection circuit is formed which includes at least one multigate protection field effect transistor includes at least two gates. The multigate protection field effect transistor is formed as a transistor that is partially depleted of electrical charge carriers, the trigger voltage of the multigate protection field effect transistor being less than the trigger voltage of the multigate functional field effect transistor.

BRIEF DESCRIPTION OF THE DRAWING

Exemplary embodiments of the invention are illustrated in the Figures and are explained in more detail below. In the Figures, identical or similar components are provided with identical reference symbols, in so far as expedient.

In the Figures:

FIG. 1 illustrates a cross-sectional view through a circuit arrangement in accordance with a first exemplary embodiment of the invention;

FIG. 2 illustrates a diagram illustrating the regions of a fully depleted field effect transistor and of a partially depleted field effect transistor as a function of different parameters;

FIG. 5 illustrates a circuit diagram of an output driver stage with an ESD protection circuit in accordance with an exemplary embodiment of the invention;

FIG. 6 illustrates a layout illustration and also a circuit diagram of a driver circuit in accordance with another exemplary embodiment of the invention;

FIGS. 7A and 7B illustrate two layout illustrations of driver circuits with integrated ESD protection in accordance with yet another exemplary embodiment of the invention, FIG. 7A showing a fully depleted driver with integrated ESD protection fins, and FIG. 7B showing a partially depleted driver with integrated ESD protection fins;

FIG. 9 illustrates a diagram illustrating experimental results of a circuit arrangement in accordance with an exemplary embodiment of the invention.

DETAILED DESCRIPTION

Figure 3:
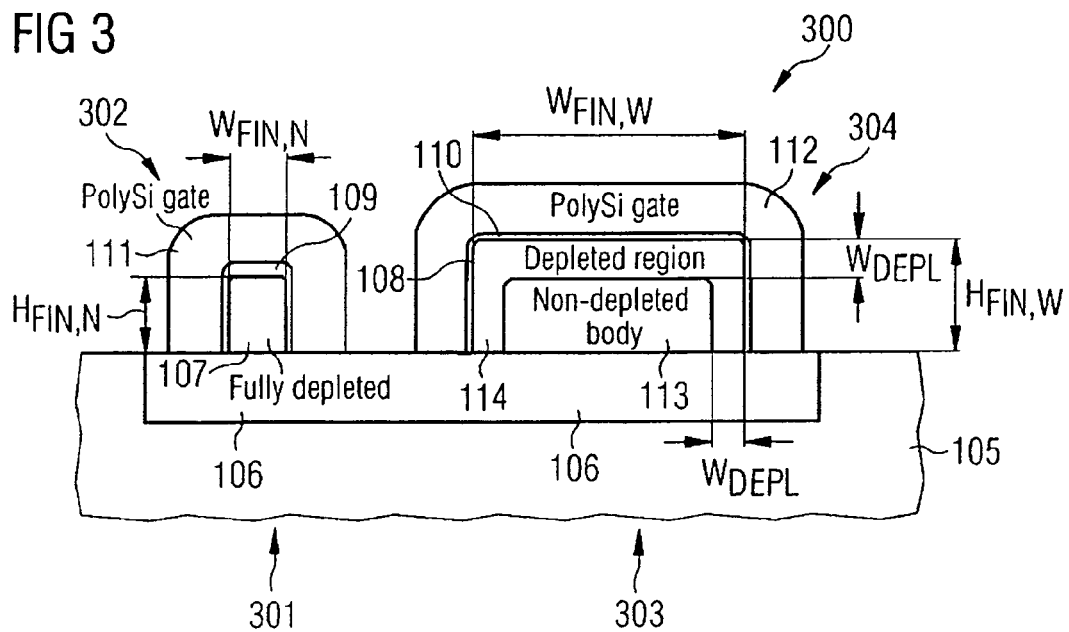
FIG. 3 illustrates a cross-sectional view through a circuit arrangement in accordance with a second exemplary embodiment of the invention.

The embodiments of the invention described relate both to the electronic circuit and to the electronic circuit arrangement and to the method for producing an electronic circuit.

In accordance with an embodiment of the invention, an electronic circuit includes at least one functional circuit which includes at least one multigate functional field effect transistor including at least two gates. Furthermore, at least one ESD protection circuit is provided which includes at least one multigate ESD protection field effect transistor including at least two gates. The multigate ESD protection field effect transistor is formed as a transistor that is partially depleted of electrical charge carriers (that is to say as a Partially Depleted field effect transistor, PD field effect transistor). The trigger voltage of the multigate protection field effect transistor is less than the trigger voltage of the multigate functional field effect transistor.

In accordance with another embodiment of the invention, the multigate functional field effect transistor is formed as a transistor that is fully depleted of electrical charge carriers (that is to say as a Fully Depleted field effect transistor, FD field effect transistor) or as a transistor that is partially depleted of electrical charge carriers (that is to say as a Partially Depleted field effect transistor, PD field effect transistor).

The functional circuit includes those electronic components which are formed for the predetermined function within a circuit arrangement; generally these are therefore the components of the electronic circuit that are to be protected against an electrostatic discharge.

An ESD protection circuit is generally to be understood to mean those components which are used for protecting the components of the functional circuit.

In the context of this description, a multigate field effect transistor is to be understood to mean a field effect transistor having at least two gates, the at least two gates being realized for example on the sidewalls of the fin applied on an insulator. A multigate field effect transistor may thus have for example two gates or else three gates if, as in the case of a trigate field effect transistor, for example, a gate is in each case arranged on both sidewalls of the fin and a gate is likewise arranged on the top of the fin and provides a desired gate control effect.

In accordance with another embodiment of the invention, the multigate functional field effect transistor may be formed as a fin field effect transistor. Furthermore, as an alternative or in addition, the multigate ESD protection field effect transistor may be formed as a fin field effect transistor.

In accordance with another embodiment of the invention, an electronic circuit arrangement includes at least one pad terminal, that is to say an external terminal of the electronic circuit arrangement, and also an electronic circuit which is electrically coupled to the pad terminal and which, for its part, includes the components described above.

In accordance with another embodiment of the invention, in a method for producing an electronic circuit, at least one functional circuit is formed which includes at least one multigate functional field effect transistor including at least two gates. Furthermore, at least one ESD protection circuit is formed which includes at least one multigate ESD protection field effect transistor including at least two gates. The multigate functional field effect transistor is formed as a transistor that is fully depleted of electrical charge carriers, and the multigate ESD protection field effect transistor is formed as a transistor that is partially depleted of electrical charge carriers.

One advantage of the invention can be seen in that, by use of exemplary embodiments of the invention, an electronic circuit may be protected reliably against destruction by electrostatic discharges in a simple manner.

An aspect of the invention that is directed at multigate field effect transistors and the ESD protection thereof is the transistor-width-dependent modulation of the ESD trigger voltage, whereby the following non-limiting exemplary advantages, among others, are achieved:

1) it is ensured that the ESD protection circuit securely protects the functional circuit, which forms for example a driver circuit, for example an input/output circuit (I/O circuit), by virtue of the at least one ESD protection field effect transistor having a lower trigger voltage when ESD conditions occur than the driver field effect transistor, that is to say the field effect transistor of the functional circuit, as a result of which the problem of so-called "trigger competition" is avoided;

2) a fast turn-on of the at least one ESD protection field effect transistor;

3) a large silicon cross-sectional region of the ESD protection field effect transistor, thereby improving the thermal properties in particular for the processing of the large ESD current;

4) large gate widths in the MOS driver field effect transistor of the functional circuit per area, as a result of which a maximum driver strength is achieved;

5) a simple design and a simple layout both of the functional circuit and of the ESD protection circuit within the electronic circuit and the electronic circuit arrangement, 6) the applicability of the invention both to double gate field effect transistors having transistors configured as multigate field effect transistors, and to trigate field effect transistors; and 7) no additional process steps are required compared with the customary production of a multigate field effect transistor for the functional circuit.

The configuration of the multigate functional field effect transistor as a fully depleted field effect transistor or the configuration of the multigate ESD protection field effect transistor as a partially depleted field effect transistor may be achieved by means of a respectively different spatial dimensioning (different geometrical dimensions for example of the fin, different heights or widths of the fins) of a multigate ESD protection field effect transistor compared with a multigate functional field effect transistor, or else by means of different doping with doping atoms of the multigate ESD protection field effect transistor compared with the respective multigate functional field effect transistor.

Clearly, therefore, by means of a different geometrical design and/or by means of a different doping with doping atoms, the multigate functional field effect transistor is dimensioned as a fully depleted multigate functional field effect transistor or the multigate ESD protection field effect transistor is formed as a respective partially depleted multigate ESD protection field effect transistor.

In accordance with another embodiment of the invention, the multigate ESD protection field effect transistor and the multigate functional field effect transistor may be formed as silicon-on-insulator field effect transistors (SOI field effect transistors), in which case the insulator layer may be for example a, for example buried, silicon oxide layer or some other insulator layer, for example a sapphire layer (Silicon-On-Sapphire, SOS).

In accordance with another embodiment of the invention, the at least one multigate functional field effect transistor may be formed as a driver field effect transistor, for example as a driver field effect transistor in an input/output driver unit (I/O driver unit) which is electrically coupled to an external pad terminal of the integrated electronic circuit.

In accordance with an alternative embodiment of the invention, by way of example, the multigate functional field effect transistor may be provided as a driver transistor within an electronic circuit comprising a plurality of different circuit components which require different supply voltages, an on-chip electrical potential gradient occurring during an ESD stress loading. These internal drivers, which also clearly form an internal interface between the different circuit components, require an on-chip ESD protection, which may likewise be provided by the ESD protection circuit. In this area of application the invention is distinguished in particular by a very simple and cost-effective possibility of providing ESD protection, in particular without generating additional production costs.

In accordance with another embodiment of the invention, the functional circuit may comprise a plurality of multigate functional field effect transistors which are coupled in parallel with one another, for example. As an alternative or in addition, the ESD protection circuit may comprise a plurality of multigate ESD protection field effect transistors which may likewise be coupled in parallel, that is to say connected in parallel with one another.

The connection in parallel of the functional field effect transistors, for example, may serve for providing a desired driver strength. The connection in parallel of the ESD protection field effect transistors, for example, may serve for providing a desired protection effect.

In accordance with another embodiment of the invention, a pre-driver circuit may be connected upstream of a multigate functional field effect transistor formed as a driver field effect transistor.

In accordance with another embodiment of the invention, the electronic circuit arrangement may further include in its functional circuit a multiplicity of multigate functional field effect transistors that are coupled in parallel with one another, and/or may include in its ESD protection circuit a multiplicity of multigate ESD protection field effect transistors that are coupled in parallel with one another.

In accordance with another embodiment of the invention, at least two multigate functional field effect transistors of the multiplicity of multigate functional field effect transistors may have a different fin width. It thus becomes possible to compensate for process nonlinearities and even to provide an ESD-self-protecting transistor arrangement having the multiplicity of multigate functional field effect transistors.

In accordance with another embodiment of the invention, by way of example, at least one of the outer (in an alternative embodiment of the invention a plurality of outer), for example the outermost or a plurality of outermost, multigate functional field effect transistors of the multiplicity of multigate functional field effect transistors may have a larger fin width than the inner multigate functional field effect transistors.

In accordance with another embodiment of the invention, at least two multigate protection field effect transistors of the multiplicity of multigate protection field effect transistors may have a different fin width. It thus becomes possible to compensate for process nonlinearities and even to provide an ESD-self-protecting transistor arrangement having the multiplicity of multigate protection field effect transistors.

In accordance with another embodiment of the invention, by way of example, at least one of the outer (in an alternative embodiment of the invention a plurality of outer), for example the outermost or a plurality of outermost, multigate protection field effect transistors of the multiplicity of multigate protection field effect transistors may have a larger fin width than the inner multigate protection field effect transistors.

In accordance with another embodiment of the invention, the multigate functional field effect transistor and the multigate protection field effect transistor are electrically coupled in parallel with one another.

In accordance with another embodiment of the invention, at least one of the outer multigate functional field effect transistors of the multiplicity of multigate functional field effect transistors may therefore comprise a larger fin width than the multigate functional field effect transistors that are clearly enclosed by the outer multigate functional field effect transistors. As an alternative or in addition, at least one of the outer multigate ESD protection field effect transistors of the multiplicity of multigate ESD protection field effect transistors may comprise a larger fin width than the inner multigate ESD protection field effect transistors that are clearly enclosed by them.

In accordance with another embodiment of the invention, the multigate functional field effect transistor or transistors and the multigate ESD protection field effect transistor or transistors may be produced using the same process technology, for example using the same process steps, in which case the different configuration of the multigate functional field effect transistors as fully depleted field effect transistors, on the one hand, and of the multigate ESD protection field effect transistors as partially depleted field effect transistors, on the other hand, may be achieved by virtue of the fact that the multigate functional field effect transistor or transistors is or are spatially dimensioned differently (for example with a different fin height or fin width) and/or doped with doping atoms differently than the multigate ESD protection field effect transistor or transistors.

In accordance with another embodiment of the invention, a first source/drain terminal of the multigate functional field effect transistor may be coupled to a first source/drain terminal of the multigate protection field effect transistor and to the pad terminal, and a second source/drain terminal of the multigate functional field effect transistor may be coupled to a second source/drain terminal of the multigate protection field effect transistor and to a predetermined reference potential.

In accordance with another embodiment of the invention, the multigate functional field effect transistor may be formed as an ESD-self-protecting multigate functional field effect transistor.

In accordance with another embodiment of the invention, a transistor that is partially depleted of electrical charge carriers may be provided as an ESD protection field effect transistor (ESD trigger field effect transistor) for driving the ESD-self-protecting multigate functional field effect transistor (to put it another way the ESD-self-protected multigate functional field effect transistor).

According to another embodiment of the invention, an electronic circuit is provided which comprises at least one functional circuit which comprises at least one multigate functional field effect transistor comprising at least two gates. Furthermore, the electronic circuit comprises at least one ESD protection circuit which comprises at least one multigate protection field effect transistor comprising at least two gates. The multigate protection field effect transistor is a transistor that is partially depleted of electrical charge carriers, the trigger voltage of the multigate protection field effect transistor being less than the trigger voltage of the multigate functional field effect transistor. According to this embodiment, the multigate functional field effect transistor is a transistor that is partially depleted of electrical charge carriers, or the multigate functional field effect transistor is a transistor that is fully depleted of electrical charge carriers.

According to another embodiment of the invention, an electronic circuit is provided which comprises at least one functional circuit which comprises at least one multigate functional field effect transistor being fully depleted of electrical charge carriers and comprising at least two gates. Furthermore, the electronic circuit comprises at least one ESD protection circuit which comprises at least one multigate protection field effect transistor being partially depleted of electrical charge carriers and comprising at least two gates.

According to another embodiment of the invention, an electronic circuit is provided which comprises at least one functional circuit which comprises at least one multigate functional field effect transistor being fully depleted of electrical charge carries and comprising at least two gates. Furthermore, the electronic circuit comprises at least one ESD protection circuit which comprises at least one multigate protection field effect transistor being partially depleted of electrical charge carriers and comprising at least two gates. According to this embodiment, the multigate function field effect transistor is a fin field effect transistor, and the multigate protection field effect transistor is also a fin field effect transistor.

Illustrative embodiments of the invention are represented in the Figures and will be explained in greater detail in the text which follows.

FIG. 1 shows an electronic circuit 100 in accordance with a first exemplary embodiment of the invention in a cross-sectional view.

The exemplary embodiments are described below on the basis of ESD protection circuits for the protection of driver field effect transistors, generally of driver circuits using multigate technology, that is to say for multigate field effect transistors.

It should be pointed out, however, that it is possible to use any other suitable application which involves protecting a multigate functional field effect transistor in a functional circuit against ESD damage by means of an ESD protection circuit.

In the context of the invention, a multigate field effect transistor is to be understood to mean for example:

1) a field effect transistor having at least one fin as part of a subcategory of double gate devices (for example double gate field effect transistors) which have a control gate on both longitudinal sidewalls of the fin but not on the top of the fin; to put it another way, in this case, no or a reduced gate control effect occurs at the upper surface of the fin, for example on account of the thickness of the thicker gate oxide situated on the upper surface of the fin or on account of an insulator layer, for example a silicon nitride layer, additionally applied on the gate oxide, or 2) a trigate device (for example a trigate field effect transistor) in which a control gate is in each case provided on the longitudinal sides of the fins and a control gate is likewise additionally provided on the upper surface of the fin.

One aspect of the following embodiments can be seen in reducing the ESD trigger voltage (that is to say the breakdown voltage of the ESD protection field effect transistors) in an ESD clamping device, which is achieved by increasing for example the width of the individual segments of the clamping devices relative to the respective segments in the driver units, that is to say for example in the driver field effect transistors. In the case where the transistors are configured as field effect transistors having at least one fin, the segments are in each case the fins of the field effect transistors, which means that the width of the fin of the field effect transistor of the ESD protection circuit is greater than the width of the fin of the field effect transistor of the functional circuit.

The larger width of the fin in the clamping device, that is to say in the ESD protection circuit, leads to a body region that is partially depleted of charge carriers (Partially Depleted (PD) body region) in accordance with this exemplary embodiment, SOI-based clamping device, that is to say ESD protection circuit.

By contrast, the driver device, that is to say the field effect transistor of the functional circuit has a very narrow (thin) fin, that is to say a fin having a very small width, to put it another way having a very small fin thickness, so that the body region of the multigate functional field effect transistor is fully depleted of electrical charge carriers (Fully Depleted (FD)), as is inherently provided as standard anyway for a multigate field effect transistor.

The multigate functional field effect transistor of the functional circuit thus differs from the multigate ESD protection field effect transistor of the ESD protection circuit in particular in the fact that the multigate functional field effect transistor (for example of a driver unit) has a higher breakdown voltage than the multigate ESD protection field effect transistor of the ESD protection circuit, thereby making it possible to form an ESD protection circuit which ensures a dependable triggering of the clamping device and prevents an ESD current from flowing through the sensitive driver unit and hence through the sensitive multigate functional field effect transistors or through the multigate functional field effect transistor.

The electronic circuit 100 in accordance with FIG. 1 has a driver circuit 101 as a functional circuit, the driver circuit 101 having at least one driver fin field effect transistor 102 (see left-hand side of FIG. 1).

The electronic circuit 100 furthermore has an ESD protection circuit (ESD: electrostatic Discharge) 103, which, in accordance with this exemplary embodiment of the invention, has an ESD fin field effect transistor 104 (see right-hand side of FIG. 1).

A silicon-on-insulator wafer (SOI wafer) is used as starting material for the production of the fin field effect transistors, according to alternative embodiments of the invention also for the production of multigate field effect transistors and generally for the production of SOI-MOS units.

The SOI wafer has a first carrier partial layer made of silicon 105, on which a buried oxide layer 106 is embedded. A thin silicon layer is applied in unpatterned form on the buried silicon oxide layer 106.

It should be noted in this connection that the invention is not restricted to silicon as semiconductor material, nor is it restricted to the use of SOI wafers. It is possible to use any desired semiconductor material which is suitable for producing multigate field effect transistors, for example including a compound semiconductor material such as gallium arsenide (GaAs), indium phosphide (InP) or else a ternary compound semiconductor material such as indium gallium arsenide (InGaAs) or else a quaternary compound semiconductor material.

The thin upper silicon layer is patterned by means of etching in such a way that a thin fin 107 made of silicon (that is to say a fin having a small width) is formed for the purpose of forming the driver fin field effect transistor 102. Furthermore, the patterning is effected in such a way that a fin 108 having a larger width (that is to say a thicker fin) compared with the fin of the driver fin field effect transistor 102 is formed for the ESD protection fin field effect transistor.

Hereinafter a designation is used in such a way that the fin 107 of the driver fin field effect transistor 102 has a width $W_{FIN,N}$ and a height $H_{FIN,N}$. The fin 108 of the ESD protection fin field effect transistor 104 has a width $W_{FIN,W}$ and a height $H_{FIN,W}$.

A thin silicon dioxide layer is applied to each of the two fins 107, 108, at least on the respective two longitudinal sidewalls of the fins 107, 108 (when producing double gate fin field effect transistors), if appropriate also on the upper surface of the fins 107, 108 (when producing trigate field effect transistors, that is to say when producing fin field effect transistors having three gates). For reasons of simple illustration, the silicon dioxide layers in FIG. 1 are provided with a respective reference symbol, namely with the reference symbol 109 for the driver fin field effect transistor 102 and with the reference symbol 110 for the ESD protection fin field effect transistor 104.

Electrically conductive gate material, in accordance with these exemplary embodiments of the invention polysilicon or a metallic compound (e.g. titanium nitride), is applied, for example deposited, on the silicon dioxide layers 109, 110 and patterned by means of photolithography, with the result that the gates 111 of the driver fin field effect transistor 102 and the gates 112 of the ESD protection fin field effect transistor 104 are formed.

In accordance with the exemplary embodiment of the invention as illustrated in FIG. 1, three gates are formed in each case, that is to say that the driver fin field effect transistor 102 has, on the longitudinal sidewalls of the fin 107, a first gate on one longitudinal sidewall and a second gate on the second longitudinal sidewall opposite to the first longitudinal side, and also a third gate applied on the upper surface of the fin 107 (also referred to as top gate electrode). For simplified illustration, all three gates of the driver fin field effect transistor 102 in FIG. 1 are provided with the reference symbol 111 and illustrated as being coupled to one another. In an alternative embodiment, provision is made for electrically decoupling two of the three or all three gates from one another and electrically driving them independently of one another in each case. In a corresponding manner and also during the same process step, in the case of the ESD protection fin field effect transistor 104, two lateral gate electrodes are formed on the two longitudinal sidewalls of the fin 108, that is to say a first gate electrode on one longitudinal sidewall and a second gate electrode on the second longitudinal sidewall opposite to the first longitudinal sidewall, and also a third gate electrode is formed on the upper surface of the fin 108. For simplified illustration, all three gates of the ESD protection field effect transistor 104 in FIG. 1 are provided with the reference symbol 112. In an alternative embodiment, provision is made for electrically decoupling two of the three or all three gates from one another and electrically driving them independently of one another in each case.

This thin strip which is formed by means of the patterning using photolithography and an etching method and which forms the gate electrode 111 of the driver fin field effect transistor 102 and also the gate electrodes 112 of the ESD protection fin field effect transistor 104 clearly envelops the fin in the narrow strip region, in which case it should be noted that the lower surface of the fins 107, 108 is electrically insulated from the substrate 105 by means of the directly underlying silicon dioxide of the buried oxide layer 106.

The channel length and channel width of the respective fin field effect transistor 102, 104 are defined, in part, by means of the form of the gate electrodes 111, 112.

In accordance with this exemplary embodiment of the invention, the gate material, in a predetermined strip-type region, covers the two sidewalls of the respective fins 107, 108 and also the upper surface of the fins 107, 108 and thus defines the respective total MOS channel width.

In accordance with this exemplary embodiment, the two fins 107, 108 have the same height, that is to say that $H_{FIN,N}$ is equal to $H_{FIN,W}$ holds true. The fin 108 of the ESD protection fin field effect transistor 104 has two fin regions, a first fin region 113, which is also referred to as a body region that is not depleted of electrical charge carriers (non-depleted body region), and a region 114 depleted of electrical charge carriers (depleted body region), which completely surrounds the region 113 that is not depleted of electrical charge carriers, apart from the underside of the non-depleted region 113 adjoining the buried silicon oxide layer 106.

In the case of a double gate field effect transistor, the fin field effect transistor 102 or 104 has a channel width that is twice as large as the fin height $H_{FIN,N}$ or $H_{FIN,W}$. In the case where the field effect transistor 102 or 104 is configured as a trigate field effect transistor, the total channel width is twice as large as the fin height plus the width of the fin $W_{FIN,N}$ or $W_{FIN,W}$. If the width of the fin 107 or 114 is increased, there gradually arises a transition from a fin field effect transistor clearly to a planar SOI field effect transistor, this structure differing from an actual planar SOI field effect transistor by virtue of the fact that gate electrodes are still always situated on the sidewalls of the fin.

However, the contribution of the MOS current which flows in the edge regions of the sidewalls of the fin decreases more and more relative to the current flowing over or through the channel. In order to be able still to ensure a sufficient field effect in such an "almost" planar SOI field effect transistor, it is expedient to apply a thin silicon oxide layer as a gate oxide layer on the upper surface of the fin 108, and a top gate thereon.

What is established by means of the different dimensioning of the widths of the two fins 107, 108 of the two field effect transistors 102, 104 is that the driver fin field effect transistor 102 is configured as a fully depleted field effect transistor and the ESD protection field effect transistor is configured as a partially depleted field effect transistor.

One reason for forming fins having a very small width is the resulting possibility of a very good scaling of the gate lengths in the range of 40 nm and below, since the so-called short channel effects (SCE) which customarily occur in customary bulk CMOS field effect transistors in planar transistors or else in partially depleted SOI structures are suppressed in the case of these very thin fins 107, 108.

The suppression of the short channel effects becomes possible through the full depletion of the respective fin region, the regions that are depleted of electrical charge carriers extending completely from the source/drain regions of the field effect transistor into the body region, with the consequence that no free charge carriers are available. This device structure enables very high MOS driver currents. For larger fin widths (and also depending on the fin height), the body region which is formed by the fin is no longer fully depleted of charge carriers. Consequently, as illustrated in FIG. 1, a non-depleted body region 113 in which mobile electrical charge carriers are available is formed in the ESD protection field effect transistor 104.

In contrast to the functional field effect transistor, the ESD protection field effect transistor does not require a high MOS driver current. The current in the case of an ESD protection field effect transistor will principally flow as a bipolar current and usually (not necessarily) the gates are fixedly grounded, that is to say fixedly connected to the ground potential. The ESD protection field effect transistor will undergo transition to the bipolar mode starting from a critical so-called trigger voltage with or without a snapback effect (reversible snapback effect), which is known per se in the case of customary CMOS bulk technologies. The trigger voltage is usually defined as the voltage at which a sufficient avalanche breakdown current flows for turning on the bipolar transistor.

In accordance with this exemplary embodiment of the invention, the trigger voltage is modulated by the width of the fin 108 in the ESD protection field effect transistor 104. A higher trigger voltage occurs for a field effect transistor that is fully depleted of charge carriers (fully depleted) with a small fin width of the multigate field effect transistor, whereby the driver field effect transistor 101 is dependably protected against undesired ESD current flow. However, in accordance with these exemplary embodiments of the invention, the ESD clamping device, that is to say the ESD protection field effect transistors 104, is only partially depleted of electrical charge carriers, that is to say that it is formed as a partially depleted field effect transistor, and the mobile electrical charge carriers enable the avalanche breakdown current to arise at a lower voltage and thus ensure the triggering of the ESD protection field effect transistor 104 in the desired manner prior to the triggering of the respectively protected functional field effect transistor, for example the driver fin field effect transistor 102.

Another advantage is evident from the fact that the ESD protection circuit can be applied to any multigate field effect transistor technology, that is to say for example to a fin-FET technology having two gates or else to a triple gate field effect transistor technology (trigate field effect transistor technology), that is to say both to a fin-FET technology with a top gate electrode and to a fin-FET technology without a top gate electrode, that is to say without a gate on the upper surface of the fin. Such a top gate is not required for the parasitic bipolar current that carries the majority of the ESD discharge current. The transition from a field effect transistor that is partially depleted of electrical charge carriers (partially depleted field effect transistor) to a field effect transistor that is fully depleted of electrical charge carriers (fully depleted field effect transistor) occurs at a layer thickness $t_{Si}$ for example of the fin of usually 10 nm to 100 nm, depending on the channel doping.

This is illustrated in greater detail in a diagram 200 in FIG. 2. In the diagram 200, the channel doping $N_{A,D}$ in cm$^{-3}$ is represented along a first axis 201. The layer thickness, that is to say for example the height of the fin of the respective field effect transistor, in meters is plotted along a second axis 202. The fully depleted region is established in a left-hand lower region 203, situated below a separating straight line 204, depending on the respective temperature and on the channel width, that is to say for example the fin width, that is to say that given these parameters the field effect transistor is formed as a field effect transistor that is fully depleted of electrical charge carriers. The parameter region 205 leading to a field effect transistor that is partially depleted of electrical charge carriers is illustrated on the right above the separating straight line 204.

In order to obtain a fully depleted fin field effect transistor with a double gate, the following condition should be met: $t_{Si}$ is less than $W_{dep}$, where $W_{dep}$ denotes the thickness of the depletion region 114 of, for example, the ESD protection field effect transistor 104.

For a fully depleted planar SOI field effect transistor, the following condition should be met: $t_{Si}$ is greater than $W_{dep}$.

It should be pointed out that the transition from a fully depleted field effect transistor to a partially depleted field effect transistor is not only a function of the silicon layer thickness, that is to say for example of the fin height, but furthermore depends on the body volume of the field effect transistor, which, for its part, is correlated with the channel length and the fin width. Therefore, the driver field effect transistor 102 may additionally have a larger channel length in order to increase the ESD trigger voltage.

It should be noted that the most efficient design parameter for increasing the ESD trigger voltage is the width of the fin, in particular in the context of the joint production and arrangement of a field effect transistor to be protected having a high ESD trigger voltage and an ESD protection field effect transistor, assigned to said field effect transistor to be protected, having a low ESD trigger voltage.

An additional degree of freedom for influencing the number of available mobile charge carriers in the channel region of the field effect transistor is to be seen for example in the fin height. If the fin of a field effect transistor is large enough, for example, then the fin prevents the region that is fully depleted of electrical charge carriers from extending down to the buried oxide, generally to the insulator layer on which the fin is arranged. A partially depleted device, that is to say a partially depleted field effect transistor, is thus once again produced, which, in accordance with these embodiments of the invention, is used as an ESD protection field effect transistor on account of its lower trigger voltage.

Different fin heights can be produced using the same process technology if different oxidation processes are used for trimming down the fin height from the original SOI material to the desired fin heights $H_{FIN,N}$ for the driver field effect transistor 102 and, respectively $H_{FIN,W}$ for the ESD protection field effect transistor 104.

It should be noted in this connection that it is advantageous to leave the original fin height of the original SOI starting material prior to trimming the fin heights for the fin height for the ESD protection field effect transistor 104 to be formed at the height of the original SOI material after the production of the SOI wafer has ended, in order thereby to obtain a maximum ESD-active field effect transistor cross-sectional area.

FIG. 3 shows an example of a circuit arrangement 300, in which the driver circuit 301 having the multigate driver fin field effect transistor 302 has a fin having a different fin height $H_{FIN,N}$ than the fin of the multigate ESD protection fin field effect transistor 304 of the ESD protection circuit 303. In this case, the height $H_{Fin,N}$ of the fin 107 of the multigate driver fin field effect transistor 302 is less than the height $H_{FIN,W}$ of the fin 108 of the ESD protection fin field effect transistor 304.

Since, apart from the different heights of the fins 107, 108 of the two transistors 302, 304, the individual elements are identical compared with the circuit arrangement 100 in accordance with the first exemplary embodiment of the invention, a repeated description of these components is dispensed with and the respective units are provided with identical reference symbols compared with FIG. 1.

Figure 4:
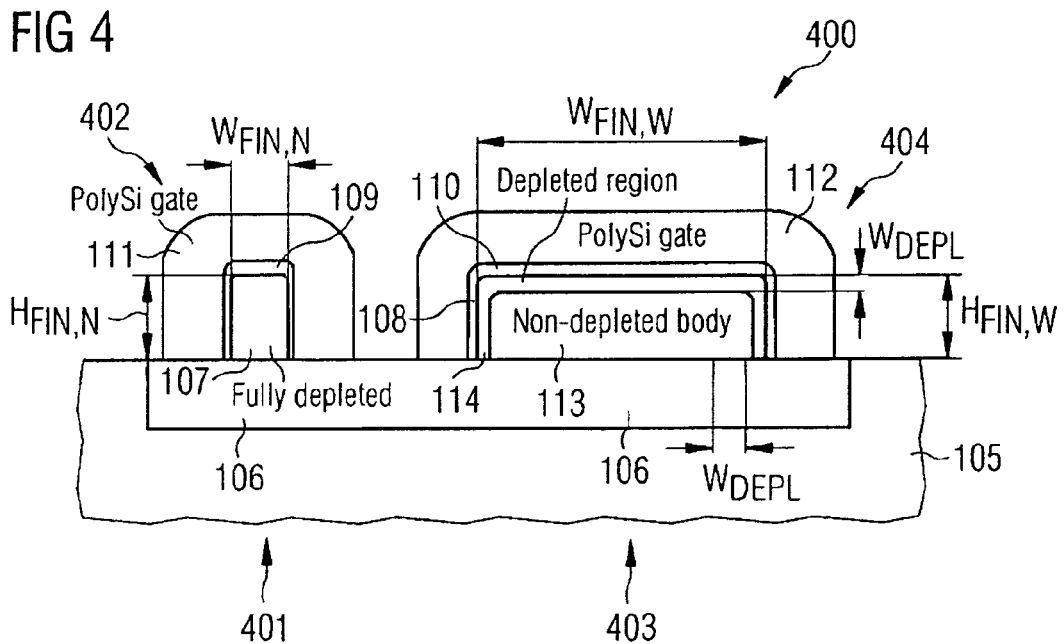
FIG. 4 illustrates a cross-sectional view through a circuit arrangement in accordance with a third exemplary embodiment of the invention.

FIG. 4 illustrates an electronic circuit 400 in accordance with a third exemplary embodiment of the invention, in which an additional degree of freedom is utilized in order to alter the number of available mobile electrical charge carriers in the fin region 107, 108 of the field effect transistors, namely the doping concentration of the doping atoms in the channel region, that is to say in accordance with these embodiments of the invention in the fin 108 of the multigate ESD protection fin field effect transistor 404 of the ESD protection circuit 403.

This embodiment of the invention provides for the channel implantation, that is to say the concentration ($N_{A,D,ESD}$) of doping atoms in the channel region and thus in the fin 108 of the multigate ESD protection fin field effect transistor 404 to be greater than the channel implantation, that is to say the concentration ($N_{A,D,Driver}$) of the doping atoms in the fin 107 of the multigate driver fin field effect transistor 402 of the driver circuit 401, that is to say that for example $N_{A,D,ESD}$ is greater than 1 ... 10×$N_{A,D,Driver}$ holds true.

In this way, the multigate ESD protection fin field effect transistor 404 is formed as a partially depleted field effect transistor and has a reduced trigger voltage.

In this case, the fin 108 of the multigate ESD protection fin field effect transistor 404 need not necessarily be wider than the fin 107 of the multigate driver fin field effect transistor 402. By way of example, in the technologies for producing multi-logic devices in which different channel implantations can be used in order to produce a set of devices having different threshold voltages, the ESD protection device and thus the multigate ESD protection fin field effect transistor 404 can be doped in a simple manner with a higher concentration of doping atoms in the channel region, that is to say in the fin 108, than the fin 107 of the multigate driver fin field effect transistor 402.

As is illustrated in FIG. 4, as a result of the increased doping concentration of doping atoms provided in the multigate ESD protection fin field effect transistor 404, the non-depleted body region 113 is enlarged relative to the first exemplary embodiment of the invention, that is to say that, to put it another way, the region 114 that is depleted of charge carriers is reduced in size (that is to say that $W_{dep}$ is reduced relative to the embodiment that was described in FIG. 1).

It is known per se that the triggering of a parasitic bipolar transistor contained in a MOS device is sufficiently fast, particularly for the case where the clamping device is set up as an NMOS field effect transistor (since an npn bipolar transistor is usually faster than a pnp field effect transistor given identical geometry and identical doping). In this way, the advantage of a higher triggering speed is achieved compared with conventional SCR devices, which have an excessively long response time.

Table 1 below illustrates the respective properties of the multigate ESD protection field effect transistor (left-hand column) and of the multigate driver field effect transistor (right-hand column):

TABLE 1

Transistor Properties

| Multigate ESD protection field effect transistor | Multigate functional field effect transistor |
|---|---|
| Partially depleted multigate field effect transistor | Fully depleted multigate field effect transistor |
| Wide fins or planar structure | Thin fins |
| Nominal channel length | Increased channel length |
| Increased channel doping | Nominal channel doping |
| High MOS threshold voltage $V_t$ (but is not disadvantageous for the invention) | Low (regular) MOS threshold voltage $V_t$ |
| Large gate oxide thickness (optional) | Small gate oxide thickness |
| Low driver current (but is not disadvantageous for the invention) | Large driver current, as desired for the functional field effect transistor |
| Low trigger voltage $V_{t1}$ approximately equal to $V_h$ (snapback hold voltage) | High trigger voltage |
| Current carrying during ESD condition | Remains in switched-off state during ESD condition |

It should be pointed out that, in alternative embodiments of the invention, the degrees of freedom described above can be combined arbitrarily with one another in order to form a fully depleted field effect transistor or an associated partially depleted field effect transistor.

FIG. 5 illustrates an electronic circuit arrangement 500 in accordance with an exemplary embodiment of the invention, which is used in conjunction with the ESD clamping method described above and the ESD clamping circuits described above.

The circuit arrangement 500 has an input/output pad terminal 501 (I/O pad terminal), to which four field effect transistors are connected. The pad terminal 501 produces the electrical connection externally to the chip.

A first multigate NMOS driver field effect transistor 502 is coupled to the I/O pad terminal 501 by its first source/drain region and to the ground potential 503 by its second source/drain region. The gate terminal of the multigate NMOS driver field effect transistor 502 is coupled to a pre-driver circuit 504 and is driven by the latter.

Furthermore, a first source/drain terminal of a multigate PMOS driver field effect transistor 505 is coupled to the first source/drain region of the multigate NMOS driver field effect transistor 502 and to the I/O pad terminal 501, the second source/drain region of said multigate PMOS driver field effect transistor 505 being coupled to the electrical operating voltage $V_{DD}$ 506. The gate terminal of the multigate PMOS driver field effect transistor 505 is coupled to a second pre-driver circuit 507 and is driven by the latter.

Furthermore, two multigate ESD protection field effect transistors are provided and coupled to the I/O pad terminal 501, in such a way that a first multigate ESD protection field effect transistor 508 is connected between the I/O pad terminal 501 and the ground potential 503 in such a way that its first source/drain terminal is coupled to the I/O pad terminal 501 and its second source/drain terminal as well as its gate terminal are coupled to the ground potential 503. Furthermore, a first source/drain terminal of a second multigate ESD protection field effect transistor 509 is likewise coupled to the I/O pad terminal 501, but its second source/drain terminal is coupled to the electrical operating potential $V_{DD}$ 506 in accordance with this exemplary embodiment of the invention. The gate terminal of the second multigate ESD protection field effect transistor 509 is coupled to the ground potential 503.

Furthermore, in accordance with this embodiment, a third multigate ESD protection field effect transistor 510 is additionally provided (optionally), the first source/drain region and also the gate terminal of which are coupled to the ground potential 503 and the second source/drain terminal of which is coupled to the electrical operating potential $V_{DD}$ 506.

Furthermore, the pre-driver circuits 504, 507 are assigned additional respective logic circuits (not illustrated) which are provided in customary integrated I/O circuits.

The two multigate driver field effect transistors 502, 505 are field effect transistors whose fins have a small(er) width and/or whose fins have a small(er) height and/or whose fins are provided with a small(er) doping concentration of doping atoms, as described above in connection with FIG. 1, FIG. 3 and FIG. 4. The multigate ESD protection field effect transistors 508, 509 and 510 are the field effect transistors whose fins have a large/larger width and/or whose fins have a large/larger height and/or whose fins are provided with a high/higher doping concentration of doping atoms, so that the trigger voltage of the multigate ESD protection field effect transistors 508, 509 and 510 is in each case greater than that of the two multigate driver field effect transistors 502, 505. What is achieved in this way is that the ESD clamping devices become conductive earlier than the driver devices. What is thereby achieved is that the ESD protection clamping devices become conductive before the multigate driver field effect transistors 502, 505 are damaged or triggered in an undesirable manner by ESD current pulses.

In the Figures, a larger fin width and/or a larger fin height and/or a higher doping concentration in the fin with doping atoms are symbolized by bold printing of the channel region of the respective field effect transistor symbol.

The third multigate ESD protection field effect transistor 510 and one or a plurality of possible additional multigate ESD protection field effect transistors (illustrated representatively by multigate ESD protection field effect transistor 510) which are connected between the electrical operating potential 506 and the ground potential 503 by their respective source/drain terminals serve for the protection of the components between the power supply lines.

FIG. 6 illustrates a layout illustration 600 and also an associated circuit diagram illustration 650 of a circuit arrangement in accordance with another exemplary embodiment of the invention.

Exclusively NMOS field effect transistors are used in this exemplary embodiment of the invention.

FIG. 6 illustrates an I/O pad terminal 651 and also a plurality of six multigate driver field effect transistors 652, 653, 654, 655, 656, 657, which are connected in parallel with one another and which are connected between the I/O pad terminal 651 and a ground terminal 658 by their two respective source/drain terminals. All the gate terminals of the multigate driver field effect transistors 652, 653, 654, 655, 656, 657 are coupled to a pre-driver circuit 659 and a corresponding control logic.

The multigate driver field effect transistors 652, 653, 654, 655, 656, 657 have a very small fin width $W_{FIN,N}$, as is set forth symbolically in the layout illustration 600. The source/drain terminals of the likewise provided plurality of multigate ESD protection field effect transistors 660, 661, 662, 663, 664, 665 are electrically contact-connected and driven by means of contact holes 601.

The multigate ESD protection field effect transistors 660, 661, 662, 663, 664, 665 are likewise connected in parallel with one another and with the multigate driver field effect transistors 652, 653, 654, 655, 656, 657; to put it another way, the multigate ESD protection field effect transistors 660, 661, 662, 663, 664, 665 are also coupled to the I/O pad terminal 651 by a respective first source/drain terminal and to the ground terminal 658 by a respective second source/drain terminal. Furthermore, all the gate terminals of the multigate ESD protection field effect transistors 660, 661, 662, 663, 664, 665 are likewise coupled to the ground terminal 658.

As a result of a plurality of respective multigate field effect transistors being connected in parallel, on the one hand the required driver strength is provided for the plurality of multigate driver field effect transistors 652, 653, 654, 655, 656, 657, and the respective required current-carrying capacity in the context of the ESD current discharge is provided for the multigate ESD protection circuits 660, 661, 662, 663, 664, 665.

As is illustrated in FIG. 6, the multigate driver field effect transistors 652, 653, 654, 655, 656, 657 in each case have a common polysilicon gate 602. The multigate ESD protection field effect transistors 660, 661, 662, 663, 664, 665 also have a common polysilicon gate 603, which is electrically decoupled, however, from the polysilicon gate 602 of the multigate driver field effect transistors 652, 653, 654, 655, 656, 657.

As is illustrated in FIG. 6, the width of the fins of the multigate ESD protection field effect transistors 660, 661, 662, 663, 664, 665 is greater than the width of the fins of the multigate driver field effect transistors 652, 653, 654, 655, 656, 657. The total width of the fins of the multigate ESD protection field effect transistors 660, 661, 662, 663, 664, 665 determines the total ESD protection loading capacity. The total width of the fins of the multigate ESD protection field effect transistors 660, 661, 662, 663, 664, 665 is calculated by adding up the width of the fins of all the multigate ESD protection field effect transistors 660, 661, 662, 663, 664, 665. As has been described above, the multigate ESD protection field effect transistors 660, 661, 662, 663, 664, 665 have a common polysilicon gate line 603 by means of which they are coupled to the ground potential 658.

The different widths of the fins can be set and altered in a very simple manner in the layout of the field effect transistors. The individual field effect transistors may have common source contacts and/or drain contacts or they may be coupled to one another via different metallization planes and metal interconnects arranged therein.

The finlike segmentation and hence the provision of multigate driver field effect transistors and multigate ESD protection field effect transistors afford an additional advantage in the context of ESD protection.

In the context of high-quality ESD protection, a uniform current conductivity during the occurrence of ESD conditions is desirable in order to obtain a scaleable performance. In bulk technologies, the insertion of ballast resistances is provided for this purpose in drain regions and/or in source regions, in order to achieve a uniform current flow. However, a local current increase would lead to an uncontrollable thermal behavior, poor ESD performance and possible failure of the components. The insertion of ballast resistances is usually achieved by means of silicide blockings which increase the sheet resistance of the source/drain regions. The silicide blockings may be applied both to the protection devices and to the driver devices to be protected, in order to increase the intrinsic ESD toughness (ESD reliability).

However, a very great increase in the series resistances is a disadvantage on account of the driver current that is thereby reduced and/or on account of the increased voltage drop during the ESD loading.

Another ballast technique is provided in an alternative embodiment. In accordance with this technique narrow strips made of polysilicon elements in each case are coupled to the drain regions and the source regions, respectively.

The above-described approach of segmentation and provision of a plurality or multiplicity of respective field effect transistors for the drivers or the ESD protection devices inherently enables ballasting for the purpose of achieving a uniform current conduction in the multigate ESD protection field effect transistors, which constitutes an additional advantage of this aspect of the invention.

In this case, there is not even any need for additional process steps for the silicide blocking. Therefore, in one embodiment of the invention it may be advantageous to limit the width of the fins and to provide a multiplicity of corresponding multigate ESD protection field effect transistors in order to optimize the ballast effect.

A circuit arrangement which has only PMOS field effect transistors both in the case of the driver field effect transistors and in the case of the multigate ESD protection field effect transistors is provided in an alternative embodiment of the invention and has a construction analogous to that illustrated in connection with FIG. 6.

For the case where the multigate driver field effect transistors are configured differently with regard to their channel conductivity compared with the multigate ESD protection field effect transistors (for example in the case where the multigate driver field effect transistors are configured as PMOS field effect transistors and the multigate ESD protection field effect transistors are configured as NMOS field effect transistors, or conversely in the case where the multigate driver field effect transistors are configured as NMOS field effect transistors and the multigate ESD protection field effect transistors are correspondingly configured as PMOS field effect transistors), in each case dedicated contact regions are to be provided for the source regions and the drain regions, respectively.

A further advantage of this aspect of the invention is to be seen in the fact that the driver devices can be arranged in such a way that a maximum number of thin fins per layout region lead to a very high driver current zone efficiency of this technology. In contrast thereto, the ESD performance is limited by the high current-carrying capacity of the ESD device segments. Consequently, the multigate ESD protection field effect transistors with wider fins also foster the fulfillment of this requirement. The area required by the narrow gaps between the individual segments, that is to say between the fins of the multigate field effect transistors and thus between the segments is negligible and scarcely impairs the overall ESD area efficiency.

FIG. 7A and FIG. 7B illustrate two layout illustrations 700 and 750 of a circuit arrangement in accordance with additional exemplary embodiments of the invention.

The circuit arrangements 700, 750 in accordance with FIG. 7A and FIG. 7B show that the fins of the respective outermost (alternatively a plurality of outer) multigate field effect transistors, that is to say the fins of the outer multigate driver field effect transistors 652 and 657 are made thicker than the fins of the inner multigate field effect transistors 653, 645, 655, 656.

In this way, it is possible to compensate for process non-linearities which possibly occur and which may occur during a lithography method, during etching or during other process steps, so that a uniform width of the respective structures is achieved or a defined state of fully depleted or partially depleted can be set. The process nonlinearities can be compensated for by means of the thicknesses of the outermost fins.

The circuit arrangement 700 exhibits driver multigate field effect transistors configured as fully depleted field effect transistors (that is to say with thin fins), and also multigate ESD protection field effect transistors, which are connected in parallel with said driver multigate field effect transistors and are configured as partially depleted field effect transistors (that is to say with thick fins). It is also possible to make a plurality of fins thick for the ESD protection, and these need not necessarily be the outer fins. Attention should be drawn in accordance with this embodiment to the common integration of the field effect transistors and to the optionally continuous gate line which electrically connects all the field effect transistors to one another.

The circuit arrangement 750 exhibits driver multigate field effect transistors configured as partially depleted field effect transistors (that is to say with thick fins), and also multigate ESD protection field effect transistors which are connected in parallel with said driver multigate field effect transistors and which are likewise configured as partially depleted field effect transistors (that is to say with thick fins, but the fins of the multigate ESD protection field effect transistors are made even thicker than the fins of the driver multigate field effect transistors). It is also possible to make a plurality of fins thick for the ESD protection, and these need not necessarily be the outer fins. Attention should be drawn in accordance with this embodiment to the common integration of the field effect transistors and to the optionally continuous gate line which electrically connects all the field effect transistors to one another.

In accordance with this embodiment, it is also possible to provide an (integrated) ESD protection for partially depleted drivers, the ESD voltage being reduced still further in a manner dependent on the fin thickness.

It generally holds true that if all the fins are drafted with the same thickness, then the outer fins become thicker as a result of the processing. If said fins are too thick, then they should be made correspondingly thinner in the layout, or conversely, if said fins are too thin (which can also happen in the processing), then they should be made correspondingly thicker in the layout.

The fact of whether a somewhat thicker or thinner fin is better also depends on the doping in order to set $V_{th}$, that is to say that the outer fins and the inner fins can be optimized separately (by means of implantations masks).

Figure 8A:
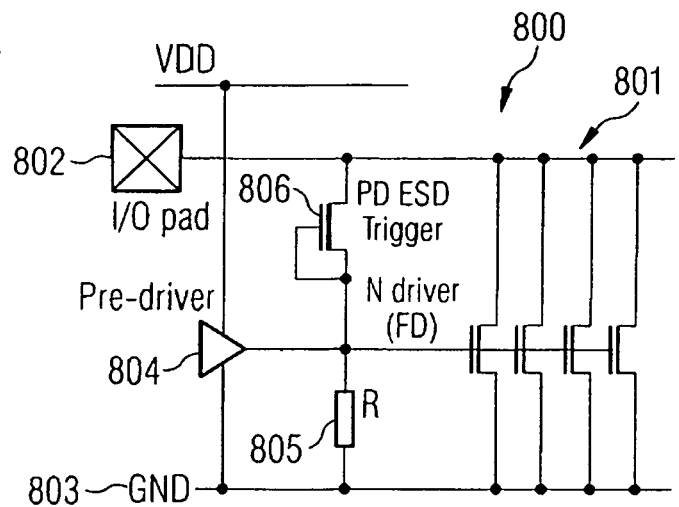
FIGS. 8A to 8C illustrate circuit diagrams of electronic circuit arrangements in accordance with further exemplary embodiments of the invention.
Figure 8B:
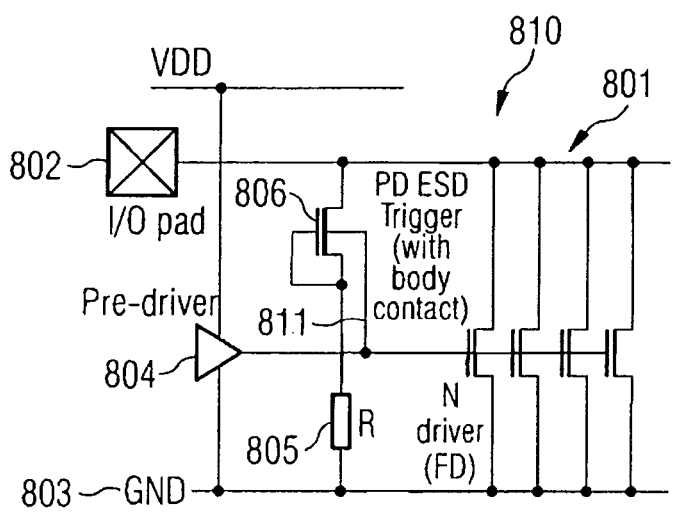
Figure 8C:
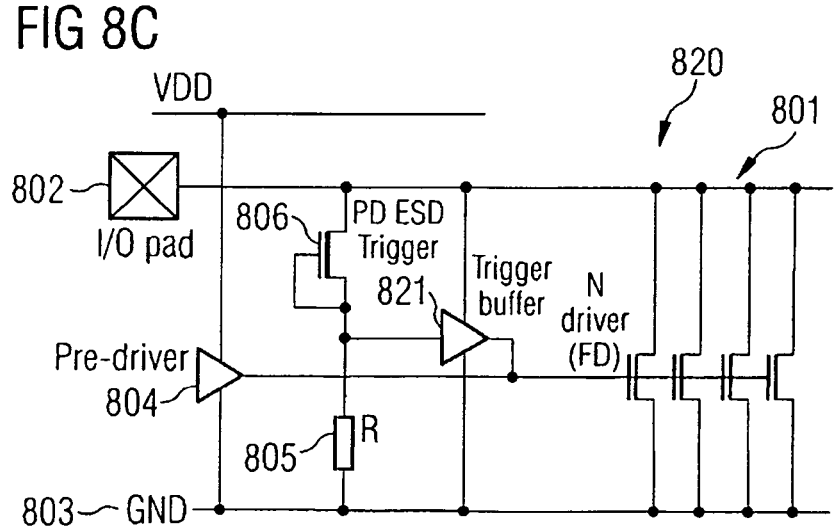

Another aspect of the invention is illustrated in FIG. 8A, FIG. 8B, and FIG. 8C.

Different variants are shown in which the low ESD trigger voltage of a device having a wide fin is used as ESD trigger element in order to protect a large array of devices having narrow fins by virtue of its being brought uniformly to ESD conductivity. Such relatively large arrays of multigate functional field effect transistors having a multiplicity of fins may be provided or necessary in a relatively large output driver device, for example, with the result that it is advantageous to provide such a device for ESD (self) protection.

It should be noted that the respective multigate ESD protection field effect transistor should be given sufficiently large dimensioning in order to be able to dissipate the total quantity of ESD current occurring, without itself being damaged.

In accordance with a first embodiment, which is shown in FIG. 8A, the circuit arrangement 800 has a plurality of multigate driver field effect transistors 801, which are all connected in parallel with one another and the first source/drain regions of which are coupled to an I/O pad terminal 802 and the second source/drain regions of which are coupled to a ground terminal 803. The gate terminals of the multigate driver field effect transistors 801 are coupled to one another and also to a pre-driver 804. Furthermore, a first terminal of a nonreactive resistor 805 is connected to the gates of the multigate driver field effect transistors 801, the second terminal of said nonreactive resistor being coupled to the ground terminal 803. Furthermore, a first source/drain terminal of a multigate ESD trigger field effect transistor 806 is coupled to the gate terminals of the multigate driver field effect transistors 801, and so is the gate terminal of said multigate ESD trigger field effect transistor 806. The second source/drain region of the multigate ESD protection field effect transistor 806 is coupled to the I/O pad 802 and also to the first source/drain regions of the multigate driver field effect transistors 801.

The pre-driver circuit 804 is connected between the ground potential 803 and the electrical operating potential $V_{DD}$ 807.

In the case of the circuit arrangement 800 in accordance with this embodiment of the invention, the partially depleted multigate ESD trigger field effect transistor 806 starts to become conductive only upon the occurrence of an ESD event. A voltage drop between the output node of the pre-driver 804 (and across the high-resistance nonreactive resistor 805 optionally provided) occurs and supplies a bias signal level to the gate terminals of the multigate driver field effect transistors 801. The multigate driver field effect transistors 801 thus open and short-circuit the ESD current flow in the direction toward the ground potential 803. The nonreactive resistor 805 is usually chosen with a high resistance (that is to say greater than 10 KΩ, for example), so that it does not constitute a significant load for the output of the pre-driver circuit 804 during normal operation.

A circuit arrangement 810 in accordance with another embodiment of the invention is shown in FIG. 8B, in accordance with this exemplary embodiment of the invention it additionally being provided and illustrated that the substrate terminal 811 is coupled to the gate terminals of the plurality of multigate driver field effect transistors 801 and likewise to the output of the pre-driver circuit 804. The gate terminal of the multigate ESD trigger field effect transistor 806 is coupled to the first source/drain terminal thereof and also to the first terminal of the optionally provided nonreactive resistor 805, the second terminal of which is coupled to the ground potential 803. In this case, however, neither the gate terminal nor the first source/drain terminal of the multigate ESD trigger field effect transistor 806 is coupled to the outputs of the multigate driver field effect transistors 801 or the output of the pre-driver circuit 804.

The substrate terminal (also referred to as body contact) is used in accordance with this embodiment of the invention to take up the increased body potential during an ESD event that occurs and to forward the potential to the gates of the multigate driver field effect transistors 801 for further treatment there. Once again, as described above, the high-resistance resistor 805 is arranged between the first source/drain terminal (the source terminal) and gate terminal of the multigate ESD trigger field effect transistor 806 in order to limit the current in the trigger element during an ESD event. Furthermore, any forward diode current which is passed from the output of the pre-driver circuit 804 through the body contact of the multigate ESD trigger field effect transistor 806 to the grounded source contact is limited by means of the nonreactive resistor 805. The advantage of this embodiment is the limiting of the gate bias voltage value by the body potential of the trigger element, that is to say of the multigate ESD protection field effect transistor 806, to approximately 0.7 V. This voltage lies securely above the threshold voltage of the driver, but is still high enough to initiate triggering in the multigate driver field effect transistors 801 during an ESD event. In this connection, it should be pointed out that a strong gate bias voltage shifts the ESD clamping voltage in an undesirable direction.

FIG. 8C shows a circuit arrangement 820 in accordance with yet another embodiment of the invention.

In the case of this circuit arrangement, an additional trigger buffer circuit 821 is provided, which is connected between the gates of the multigate driver field effect transistors 801 and the output of the pre-driver circuit 804, on the one hand, and the first source/drain terminal and the gate terminal of the multigate ESD protection field effect transistor 806, on the other hand.

This embodiment of the invention otherwise corresponds to the circuit 800 illustrated in FIG. 8A.

What is achieved by the circuit arrangement 820 is that the trigger biasing signal is amplified by the (noninverting) trigger buffer circuit 821. As a result, the pre-driver output is not loaded with the nonreactive resistor 805 during normal operation. The ESD trigger buffer circuit 821 is supplied by the ESD voltage present at the I/O pad terminal 802, which is thus clearly biased, during the existence of ESD conditions.

In all cases, the ESD trigger element is set up in such a way that what is achieved for example using the methods described above is that in the respective body region of a multigate ESD protection field effect transistor, a low trigger voltage is made possible on account of the partial depletion of electrical charge carriers achieved in the body region. The ESD trigger element may have one or more fins and thus clearly one or more multigate ESD protection field effect transistors in order to provide the required quantity of trigger current.

FIG. 9 illustrates experimental results in a current/voltage diagram 900, in which the electrical voltage (V) is plotted along a first axis 901 and a normalized current (I) is plotted along a second axis 902. The pulsed IV characteristic curves for a partially depleted (PD) planar field effect transistor and a fully depleted multigate field effect transistor (for pulses having a duration of 100 ns) are presented. Both devices have a polysilicon gate length of 250 nm in order to keep the results comparable. The gate of the devices is grounded in both cases. The currents are normalized with regard to the actual fin width. As can be seen from the voltage-current diagram 900, the partially depleted device (that is to say the ESD protection device) has a significantly lower trigger voltage (designated as $V_{t1,PD}$ there) under ESD conditions, as has been explained above.

Thus there is disclosed an electronic circuit, electronic circuit arrangement and method for producing an electronic circuit that fully provides the features and advantages of the above. Those skilled in the art will appreciate that modifications can be made without departing from the scope of the invention. Accordingly, it is intended that all such modifications be included with the scope of the invention as set forth in the appended claims and equivalents thereof.

The invention claimed is:

1. An electronic circuit comprising:
   at least one functional circuit which comprises at least one multigate functional field effect transistor comprising at least two gates; and
   at least one ESD protection circuit which comprises at least one multigate protection field effect transistor comprising at least two gates,
   the at least one multigate protection field effect transistor comprising a transistor having at least two gates controlling a single body region that is partially depleted of electrical charge carriers, such that the trigger voltage of the at least one multigate protection field effect transistor is less than the trigger voltage of the at least one multigate functional field effect transistor, such that during ESD conditions triggering of a parasitic bipolar transistor contained in the protection field effect transistor occurs prior to triggering of the functional field effect transistor, thereby protecting the functional circuit.

2. The electronic circuit as claimed in claim 1, wherein the at least one multigate functional field effect transistor comprises a transistor that is partially depleted of electrical charge carriers.

3. The electronic circuit as claimed in claim 1, wherein the at least one multigate functional field effect transistor comprises a transistor that is fully depleted of electrical charge carriers.

4. The electronic circuit as claimed in claim 1, wherein the at least one multigate functional field effect transistor or the at least one multigate protection field effect transistor comprises a fin field effect transistor.

5. The electronic circuit as claimed in claim 1, wherein the at least one multigate functional field effect transistor and the at least one multigate protection field effect transistor each comprise a fin field effect transistor.

6. The electronic circuit as claimed in claim 1, wherein the at least one multigate protection field effect transistor comprises one of a transistor that is spatially dimensioned differently than the at least one multigate functional field effect transistor, or a transistor that is doped with doping atoms differently than the at least one multigate functional field effect transistor.

7. The electronic circuit as claimed in claim 1, wherein the at least one multigate protection field effect transistor comprises a transistor that is spatially dimensioned differently than the at least one multigate functional field effect transistor and that is doped with doping atoms differently than the at least one multigate functional field effect transistor.

8. The electronic circuit as claimed in claim 1, wherein the at least one multigate protection field effect transistor and the at least one multigate functional field effect transistor each comprise silicon-on-insulator transistors.

9. The electronic circuit as claimed in claim 1, wherein the at least one multigate functional field effect transistor comprises a driver transistor.

10. The electronic circuit as claimed in claim 1, wherein the at least one functional circuit comprises a plurality of multigate functional field effect transistors, or the at least one ESD protection circuit comprises a plurality of multigate protection field effect transistors.

11. The electronic circuit as claimed in claim 1, wherein the at least one functional circuit comprises a plurality of multigate functional field effect transistors, and the ESD protection circuit comprises a plurality of multigate protection field effect transistors.

12. The electronic circuit as claimed in claim 1, wherein the at least one functional circuit comprises a plurality of multigate functional field effect transistors coupled in parallel with one another, or the at least one ESD protection circuit comprises a plurality of multigate protection field effect transistors coupled in parallel with one another.

13. The electronic circuit as claimed in claim 1, wherein the at least one functional circuit comprises a plurality of multigate functional field effect transistors coupled in parallel with one another, and the at least one ESD protection circuit comprises a plurality of multigate protection field effect transistors coupled in parallel with one another.

14. The electronic circuit as claimed in claim 1, wherein the at least one functional circuit comprises a plurality of multigate functional field effect transistors coupled in parallel with one another and at least two multigate functional field effect transistors of the plurality of multigate functional field effect transistors comprise transistors having a different fin width.

15. The electronic circuit as claimed in claim 14, wherein the plurality of multigate functional field effect transistors comprise outer transistors and inner transistors and at least one of the outer transistors has a larger fin width than the inner transistors.

16. The electronic circuit as claimed in claim 1, wherein the at least one ESD protection circuit comprises a plurality of multigate protection field effect transistors coupled in parallel with one another and at least two of the multigate protection field effect transistors of the plurality of multigate protection field effect transistors have a different fin width.

17. The electronic circuit as claimed in claim 16, wherein the plurality of multigate protection field effect transistors comprise outer transistors and inner transistors and at least one of the outer transistors have a larger fin width than the inner transistors.

18. The electronic circuit as claimed in claim 1, wherein the at least one multigate functional field effect transistor and the at least one multigate protection field effect transistor comprise transistors electrically coupled in parallel with one another.

19. An electronic circuit arrangement comprising:
a pad terminal and an electronic circuit electrically coupled to the pad terminal, the electronic circuit comprising:
at least one functional circuit which comprises at least one multigate functional field effect transistor comprising at least two gates; and
at least one ESD protection circuit which comprises at least one multigate protection field effect transistor comprising at least two gates,
the at least one multigate protection field effect transistor comprising a transistor having at least two gates controlling a single body region that is partially depleted of electrical charge carriers, such that the trigger voltage of the at least one multigate protection field effect transistor is less than the trigger voltage of the at least one multigate functional field effect transistor, such that during ESD conditions triggering of a parasitic bipolar transistor contained in the protection field effect transistor occurs prior to triggering of the functional field effect transistor, thereby protecting the functional circuit.

20. The electronic circuit arrangement as claimed in claim 19, further comprising:
a first source/drain terminal of the at least one multigate functional field effect transistor coupled to a first source/drain terminal of the at least one multigate protection field effect transistor and to the pad terminal; and
a second source/drain terminal of the at least one multigate functional field effect transistor coupled to a second source/drain terminal of the at least one multigate protection field effect transistor and to a predetermined reference potential.

21. The electronic circuit arrangement as claimed in claim 19, wherein the at least one multigate functional field effect transistor comprises a transistor that is partially depleted of electrical charge carriers.

22. The electronic circuit arrangement as claimed in claim 19, wherein the at least one multigate functional field effect transistor comprises a transistor that is fully depleted of electrical charge carriers.

23. The electronic circuit arrangement as claimed in claim 19, further comprising a pre-driver circuit coupled to the at least one multigate functional field effect transistor.

24. The electronic circuit arrangement as claimed in claim 19, wherein the at least one functional circuit comprises a plurality of multigate functional field effect transistors, or the at least one ESD protection circuit comprises a plurality of multigate protection field effect transistors.

25. The electronic circuit arrangement as claimed in claim 19, wherein the at least one functional circuit comprises a plurality of multigate functional field effect transistors, and the at least one ESD protection circuit comprises a plurality of multigate protection field effect transistors.

26. The electronic circuit arrangement as claimed in claim 19, wherein the at least one multigate functional field effect transistor comprises a plurality of multigate functional field effect transistors coupled in parallel with one another, or the at least one multigate protection field effect transistor comprises a plurality of multigate protection field effect transistors coupled in parallel with one another.

27. The electronic circuit arrangement as claimed in claim 19, wherein the at least one multigate functional field effect transistor comprises a plurality of multigate functional field effect transistors coupled in parallel with one another, and the at least one multigate protection field effect transistor comprises a plurality of multigate protection field effect transistors coupled in parallel with one another.

28. The electronic circuit arrangement as claimed in claim 19, wherein the at least one functional circuit comprises a plurality of multigate functional field effect transistors coupled in parallel with one another, and at least two multigate functional field effect transistors of the plurality of multigate functional field effect transistors comprise transistors having a different fin width.

29. The electronic circuit arrangement as claimed in claim 28, wherein the plurality of multigate functional field effect transistors comprise outer transistors and inner transistors and at least one of the outer transistors has a larger fin width than the inner transistors.

30. The electronic circuit arrangement as claimed in claim 19, wherein the at least one ESD protection circuit comprises a plurality of multigate protection field effect transistors coupled in parallel with one another, and at least two multigate protection field effect transistors of the plurality of multigate protection field effect transistors have a different fin width.

31. The electronic circuit arrangement as claimed in claim 30, wherein the plurality of multigate protection field effect transistors comprise inner transistors and outer transistors and wherein at least one of the outer transistors has a larger fin width than the inner multigate protection field effect transistors.

32. The electronic circuit arrangement as claimed in claim 19, wherein the at least one multigate functional field effect transistor comprises an ESD-self-protecting multigate functional field effect transistor.

33. The electronic circuit arrangement as claimed in claim 32, further comprising a transistor that is partially depleted of electrical charge carriers provided as an ESD protection field effect transistor for driving the ESD-self-protecting multigate functional field effect transistor.

34. A method for producing an electronic circuit comprising:
forming at least one functional circuit which comprises at least one multigate functional field effect transistor comprising at least two gates; and
forming at least one ESD protection circuit which comprises at least one multigate protection field effect transistor comprising at least two gates,
the at least one multigate protection field effect transistor being formed as a transistor having at least two gates controlling a single body region that is partially depleted of electrical charge carriers, such that the trigger voltage of the at least one multigate protection field effect transistor is less than the trigger voltage of the at least one multigate functional field effect transistor, such that during ESD conditions triggering of a parasitic bipolar transistor contained in the protection field effect transistor occurs prior to triggering of the functional field effect transistor, thereby protecting the functional circuit.

35. The method as claimed in claim 34, wherein forming the at least one functional circuit comprises forming the at least one multigate functional field effect transistor as a transistor that is partially depleted of electrical charge carriers.

36. The method as claimed in claim 34, wherein forming the at least one functional circuit comprises forming the at least one multigate functional field effect transistor as a transistor that is fully depleted of electrical charge carriers.

37. The method as claimed in claim 34, wherein forming the at least one functional circuit comprises forming the at least one multigate functional field effect transistor as a multigate functional fin field effect transistor, or forming the at least one ESD protection circuit comprises forming the at least one multigate protection field effect transistor as a multigate protection fin field effect transistor.

38. The method as claimed in claim 34, wherein forming the at least one functional circuit comprises forming the at least one multigate functional field effect transistor as a multigate functional fin field effect transistor, and
forming the at least one ESD protection circuit comprises forming the at least one multigate protection field effect transistor as a multigate protection fin field effect transistor.

39. The method as claimed in claim 34, wherein forming the at least one functional circuit and forming the at least one ESD protection circuit comprises forming the at least one multigate functional field effect transistor and the at least one multigate protection field effect transistor using the same process technology.

40. The method as claimed in claim 39, wherein the at least one multigate functional field effect transistor and the at least one multigate protection field effect transistor are formed using the same process steps.

41. The method as claimed in claim 39, wherein the at least one multigate functional field effect transistor is formed such that the at least one multigate functional field effect transistor is either spatially dimensioned differently or doped with doping atoms differently than the at least one multigate protection field effect transistor.

42. The method as claimed in claim 39, wherein the at least one multigate functional field effect transistor is formed such that the at least one multigate functional field effect transistor is spatially dimensioned differently and doped with doping atoms differently than the at least one multigate protection field effect transistor.

43. An electronic circuit comprising:
at least one functional circuit which comprises at least one multigate functional field effect transistor comprising at least two gates; and
at least one ESD protection circuit which comprises at least one multigate protection field effect transistor comprising at least two gates,
wherein the at least one multigate protection field effect transistor comprises a transistor having at least two gates controlling a single body region that is partially depleted of electrical charge carriers, such that the trigger voltage of the multigate protection field effect transistor is less than the trigger voltage of the at least one multigate functional field effect transistor, such that during ESD conditions triggering of a parasitic bipolar transistor contained in the protection field effect transistor occurs prior to triggering of the functional field effect transistor, thereby protecting the functional circuit, and
wherein the at least one multigate functional field effect transistor comprises one of a transistor that is partially depleted of electrical charge carriers, or
a transistor that is fully depleted of electrical charge carriers.

44. An electronic circuit comprising:
at least one functional circuit which comprises at least one multigate functional field effect transistor that is fully depleted of electrical charge carriers and comprising at least two gates; and
at least one ESD protection circuit which comprises at least one multigate protection field effect transistor having at least two gates controlling a single body region that is partially depleted of electrical charge carriers,
such that during ESD conditions triggering of a parasitic bipolar transistor contained in the protection field effect transistor occurs prior to triggering of the functional field effect transistor, thereby protecting the functional circuit.

45. The electronic circuit as claimed in claim 44, wherein the at least one multigate functional field effect transistor comprises a fin field effect transistor, or the at least one multigate protection field effect transistor comprises a fin field effect transistor.

46. An electronic circuit comprising:
at least one functional circuit which comprises at least one multigate functional field effect transistor that is fully depleted of electrical charge carriers and comprising at least two gates; and at least one ESD protection circuit which comprises at least one multigate protection field effect transistor having at least two gates controlling a single body region that is partially depleted of electrical charge carriers, such that during ESD conditions triggering of a parasitic bipolar transistor contained in the protection field effect transistor occurs prior to triggering of the functional field effect transistor, thereby protecting the functional circuit, and wherein the at least one multigate function field effect transistor comprises a fin field effect transistor, and the multigate protection field effect transistor comprises a fin field effect transistor.

\* \* \* \* \*